(12) United States Patent
Sakamoto

(10) Patent No.: US 8,188,404 B2
(45) Date of Patent: May 29, 2012

(54) LASER PROCESSING METHOD AND LASER PROCESSING APPARATUS

(75) Inventor: Takeshi Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 652 days.

(21) Appl. No.: 12/441,186

(22) PCT Filed: Sep. 18, 2007

(86) PCT No.: PCT/JP2007/068099
§ 371 (c)(1),
(2), (4) Date: Apr. 22, 2009

(87) PCT Pub. No.: WO2008/035679
PCT Pub. Date: Mar. 27, 2008

(65) Prior Publication Data
US 2009/0250446 A1 Oct. 8, 2009

(30) Foreign Application Priority Data
Sep. 19, 2006 (JP) .................. P2006-253259

(51) Int. Cl.
*H01L 21/301* (2006.01)
*B23K 26/02* (2006.01)
(52) U.S. Cl. ............. 219/121.68; 219/121.69; 438/113; 438/114
(58) Field of Classification Search ............. 219/121.67, 219/121.68; 438/113, 114
See application file for complete search history.

(56) References Cited

U.S. PATENT DOCUMENTS

| 6,992,026 | B2 | 1/2006 | Fukuyo et al. |
| 7,179,722 | B2* | 2/2007 | Murata et al. ................. 438/460 |
| 7,396,742 | B2 | 7/2008 | Fukuyo et al. |
| 7,489,454 | B2 | 2/2009 | Fukuyo et al. |
| 7,547,613 | B2 | 6/2009 | Fukuyo et al. |
| 7,566,635 | B2 | 7/2009 | Fujii et al. |
| 7,592,237 | B2 | 9/2009 | Sakamoto et al. |
| 7,592,238 | B2 | 9/2009 | Fukuyo et al. |
| 7,605,344 | B2 | 10/2009 | Fukumitsu |

(Continued)

FOREIGN PATENT DOCUMENTS

CN 1572452 2/2005

(Continued)

OTHER PUBLICATIONS

Kiyotaka Miura et al., "Formation of Photo-induced Structures in Glasses with Femtosecond Laser," Proceedings of $42^{nd}$ Laser Materials Processing Conference, Nov. 1997, pp. 105-111 [w/English abstract].

(Continued)

*Primary Examiner* — Samuel M Heinrich
(74) *Attorney, Agent, or Firm* — Drinker Biddle & Reath LLP

(57) ABSTRACT

In six rows of molten processed regions $13_1$, $13_2$, the molten processed region $13_1$ closest to a front face $17a$ of a metal film 17 opposing a front face 3 of an object to be processed 1 acting as a laser light entrance surface is formed by irradiating a silicon wafer 11 with a reflected light component of laser light L reflected by the front face $17a$ of the metal film 17. This can form the molten processed region $13_1$ very close to the front face $17a$ of the metal film 17.

10 Claims, 27 Drawing Sheets

U.S. PATENT DOCUMENTS

| | | |
|---|---|---|
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 2005/0202596 A1 | 9/2005 | Fukuyo et al. |
| 2005/0272223 A1 | 12/2005 | Fujii et al. |
| 2006/0144828 A1 | 7/2006 | Fukumitsu et al. |
| 2006/0148212 A1 | 7/2006 | Fukuyo et al. |
| 2006/0255024 A1 | 11/2006 | Fukuyo et al. |
| 2007/0085099 A1 | 4/2007 | Fukumitsu et al. |
| 2007/0111480 A1 | 5/2007 | Maruyama et al. |
| 2007/0125757 A1 | 6/2007 | Fukuyo et al. |
| 2007/0158314 A1 | 7/2007 | Fukumitsu et al. |
| 2007/0170159 A1 | 7/2007 | Fukumitsu |
| 2007/0252154 A1 | 11/2007 | Uchiyama et al. |
| 2007/0287267 A1 | 12/2007 | Sakamoto et al. |
| 2007/0290299 A1 | 12/2007 | Sakamoto et al. |
| 2008/0000884 A1 | 1/2008 | Sugiura et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |
| 2009/0008373 A1 | 1/2009 | Muramatsu et al. |
| 2009/0026185 A1 | 1/2009 | Sakamoto |
| 2009/0032509 A1 | 2/2009 | Kuno et al. |
| 2009/0081851 A1 | 3/2009 | Sakamoto et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0032418 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0200550 A1 | 8/2010 | Kumagai |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0311313 A1 | 12/2010 | Uchiyama |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0274128 A1 | 11/2011 | Fukumitsu et al. |

FOREIGN PATENT DOCUMENTS

| | | |
|---|---|---|
| JP | 2004-343008 | 12/2004 |
| JP | 2005-57257 | 3/2005 |
| JP | 2007-141995 | 6/2007 |
| WO | 2005/007335 | 1/2005 |

OTHER PUBLICATIONS

Ken-Ichi Hayashi, "Inner Glass Marking by Harmonics of Solid State Laser," Proceedings of 45$^{th}$ Laser Materials Processing Conference, Dec. 1998, pp. 23-28 [w/English abstract].

T. Sano et al, "Evaluation of Processing Characteristics of Silicon with Picosecond Pulse Laser," Preprints of the National Meeting of Japan Welding Society, Apr. 2000, pp. 72-73, No. 66 [w/English translation].

U.S. Appl. No. 11/667,596, filed May 11, 2007, Sugiura et al.
U.S. Appl. No. 12/031,382, filed Feb. 14, 2008, Sakamoto.
U.S. Appl. No. 12/063,560, filed May 13, 2008, Sakamoto et al.
U.S. Appl. No. 11/994,581, filed May 16, 2008, Sakamoto et al.
U.S. Appl. No. 12/159,338, filed Jun. 26, 2008, Sakamoto et al.
U.S. Appl. No. 10/594,907, filed Aug. 7, 2008, Sakamoto et al.
U.S. Appl. No. 12/305,497, filed Dec. 18, 2008, Sakamoto.
U.S. Appl. No. 12/094,050, filed Feb. 6, 2009, Sakamoto.
U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.

* cited by examiner (a)

(b)

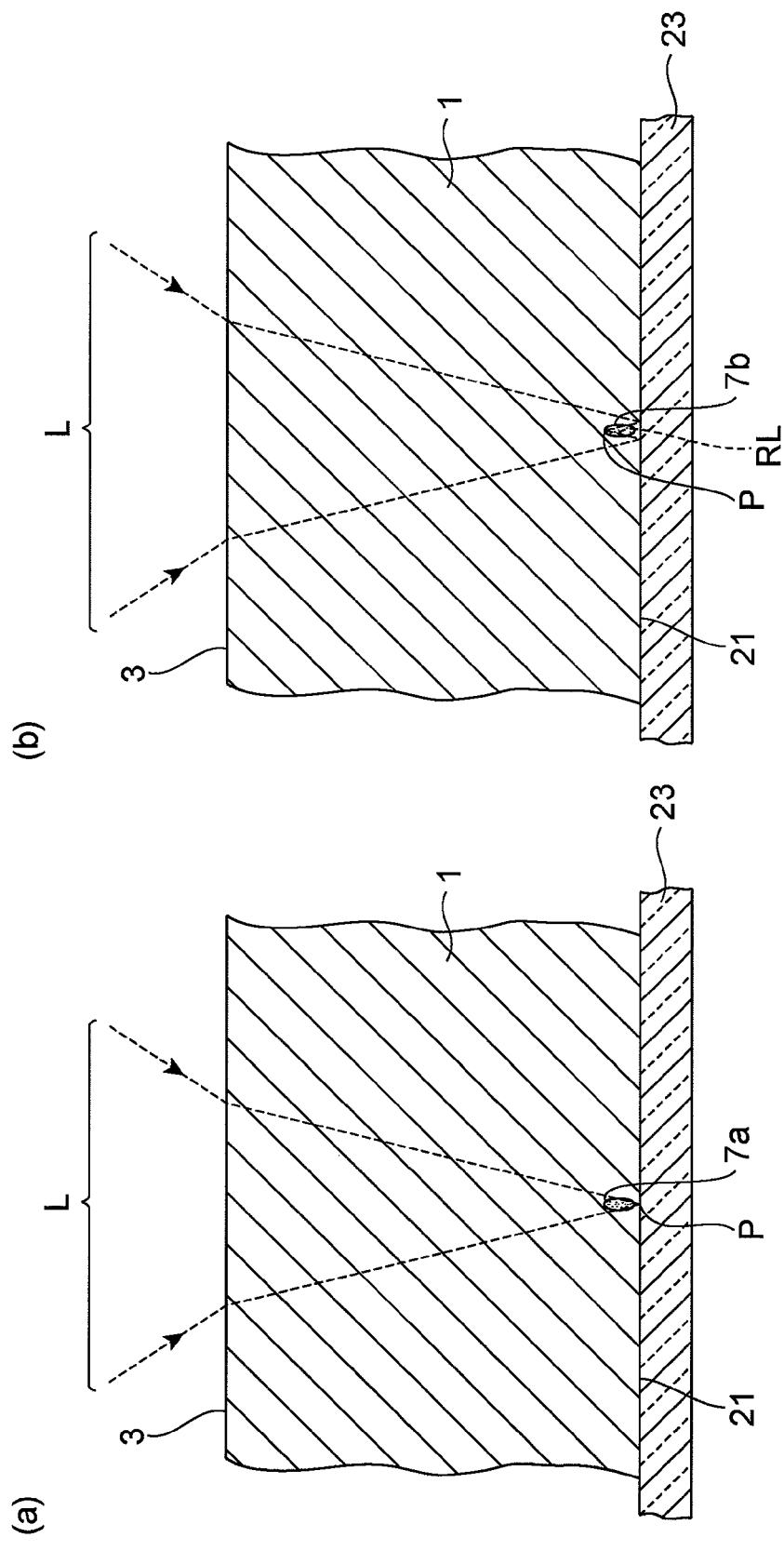

LASER PROCESSING METHOD AND LASER PROCESSING APPARATUS

TECHNICAL FIELD

The present invention relates to a laser processing method and laser processing apparatus for cutting a planar object to be processed along a line to cut.

BACKGROUND ART

Known as a conventional laser processing method is a method which irradiates a planar object to be processed with laser light, so as to form a plurality of rows of modified regions to become a cutting start point aligning in a thickness direction of the object within the object along a line to cut the object (see, for example, Patent Literature 1).
Patent Literature 1: Japanese Patent Application Laid-Open No. 2004-343008

DISCLOSURE OF INVENTION

Technical Problem

Meanwhile, it will be preferred in a laser processing method such as the one mentioned above if the modified region closest to a predetermined surface (e.g. the rear face of the object) opposing the laser light entrance surface (e.g., the front face of the object) where the laser light is incident on the object is formed very close to the predetermined surface. It will also be preferred if the modified region closest to the laser light entrance surface is formed very close to the laser light entrance surface. This is because, if these modified regions are formed at positions remote from the predetermined surface and laser light entrance surface, end parts of cut sections in the thickness direction of the object formed when cutting the object may greatly deviate from the line to cut.

When the modified region closest to the predetermined surface is attempted to be formed very close to a predetermined surface in the laser processing method mentioned above, however, the modified region closest to the predetermined surface may partly be formed at a position remote from the predetermined surface if the thickness of the object varies along the line to cut, for example. Also, when the modified region closest to the laser light entrance surface is attempted to be formed very close to a laser light entrance surface, the laser light entrance surface may incur damages such as melting because of the temperature dependency of absorption coefficient (which will be explained later in detail), for example. Thus, the modified region closest to a predetermined surface has often been hard to form very close to the predetermined surface.

In view of such circumstances, it is an object of the present invention to provide a laser processing method and laser processing apparatus which can form the modified region closest to a predetermined surface very close to the predetermined surface or the modified region closest to a laser light entrance surface very close to the laser light entrance surface.

Solution to Problem

For achieving the above-mentioned object, the laser processing method in accordance with the present invention is a laser processing method of irradiating a planar object to be processed with laser light, so as to form a plurality of rows of modified regions to become a cutting start point aligning in a thickness direction of the object within the object along a line to cut the object, the method irradiating the object with a reflected light component of the laser light reflected by a predetermined surface opposing a laser light entrance surface where the laser light is incident on the object, so as to form one or more rows of modified regions including at least one row of the modified region closest to the predetermined surface and the modified region closest to the laser light entrance surface in the plurality of rows of modified regions.

By irradiating the object with a reflected light component of laser light reflected by a predetermined surface opposing a laser light entrance surface where the laser light is incident on the object, this laser processing method forms one or more rows of modified regions including at least one row of the modified region closest to the predetermined surface and the modified region closest to the laser light entrance surface in a plurality of rows of modified regions. This makes it possible to form the modified region closest to a predetermined surface very close to the predetermined surface or the modified region closest to the laser light entrance surface very close to the laser light entrance surface.

Each modified region is formed by generating multiphoton absorption or other kinds of optical absorption within the object by irradiating the object with the laser light.

The laser processing method in accordance with the present invention encompasses a case where the predetermined surface is a surface on the laser light entrance surface side of a metal film provided with the object.

Preferably, in the laser processing method in accordance with the present invention, the object is cut along the line to cut from the plurality of rows of modified regions acting as a cutting start point. This can accurately cut the object along the line to cut.

The laser processing method in accordance with the present invention encompasses a case where the object has a semiconductor substrate, while the modified region includes a molten processed region.

Advantageous Effects of Invention

The present invention can form the modified region closest to a predetermined surface very close to the predetermined surface or the modified region closest to a laser light entrance surface very close to the laser light entrance surface.

BRIEF DESCRIPTION OF DRAWINGS

FIG. 27 is a partial sectional view of the object for explaining the laser processing method in accordance with still another embodiment.

REFERENCE SIGNS LIST

1 . . . object to be processed;
3 . . . front face (laser light entrance surface);
5 . . . line to cut;
11 . . . silicon wafer (semiconductor substrate);
13$_1$, 13$_2$ . . . molten processed region (modified region);
17 . . . metal film;
17*a* . . . front face (predetermined surface);
L . . . laser light;
RL . . . reflected light component

DESCRIPTION OF EMBODIMENTS

In the following, a preferred embodiment of the present invention will be explained in detail with reference to the drawings. In the laser processing method in accordance with the embodiment, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 1:
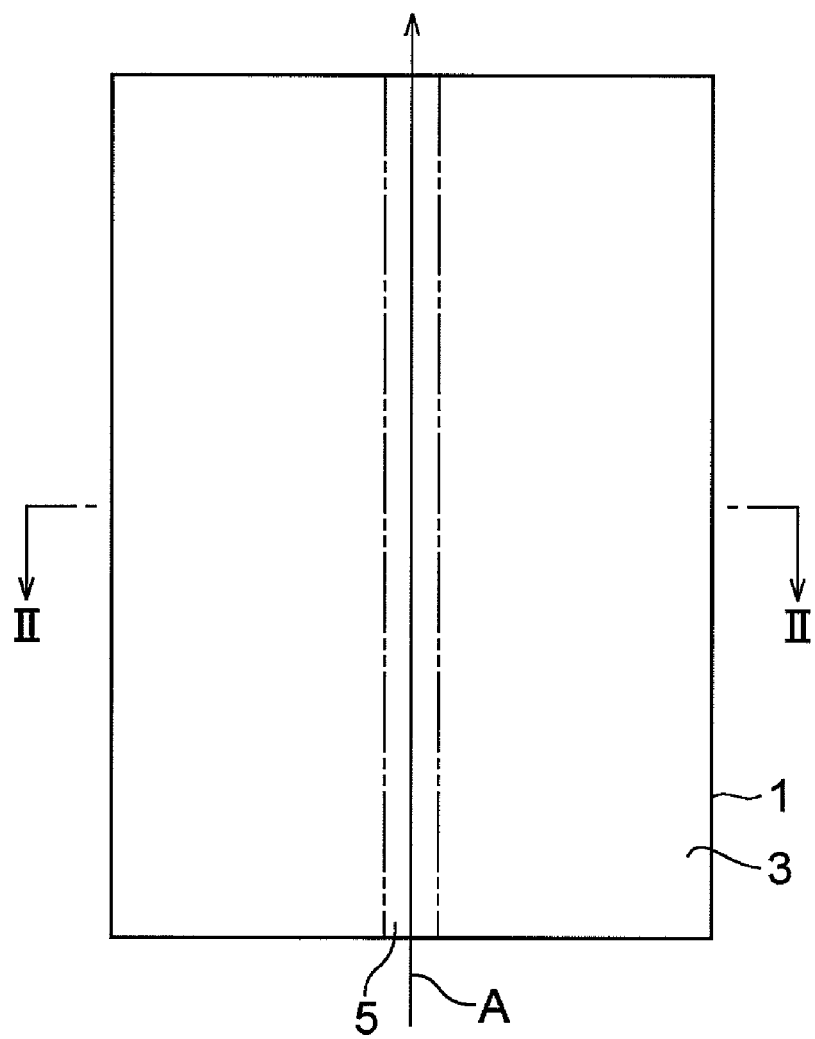
FIG. 1 is a plan view of an object to be processed during laser processing by the laser processing method in accordance with an embodiment.
Figure 2:
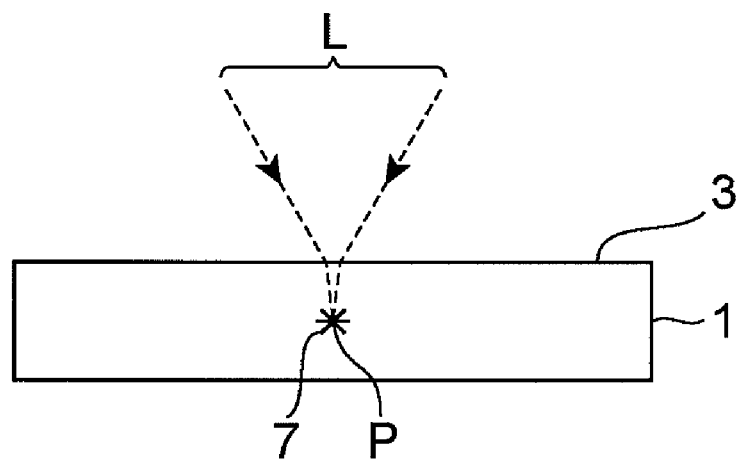
FIG. 2 is a sectional view of the object taken along the line II-II of FIG. 1.

The principle of the laser processing method in accordance with the embodiment using such multiphoton absorption will be explained with reference to FIGS. 1 to 6. As illustrated in FIG. 1, on a front face 3 of a wafer-like (planar) object to be processed 1, a line to cut 5 for cutting the object 1 exists. The line to cut 5 is a virtual line extending straight. As illustrated in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
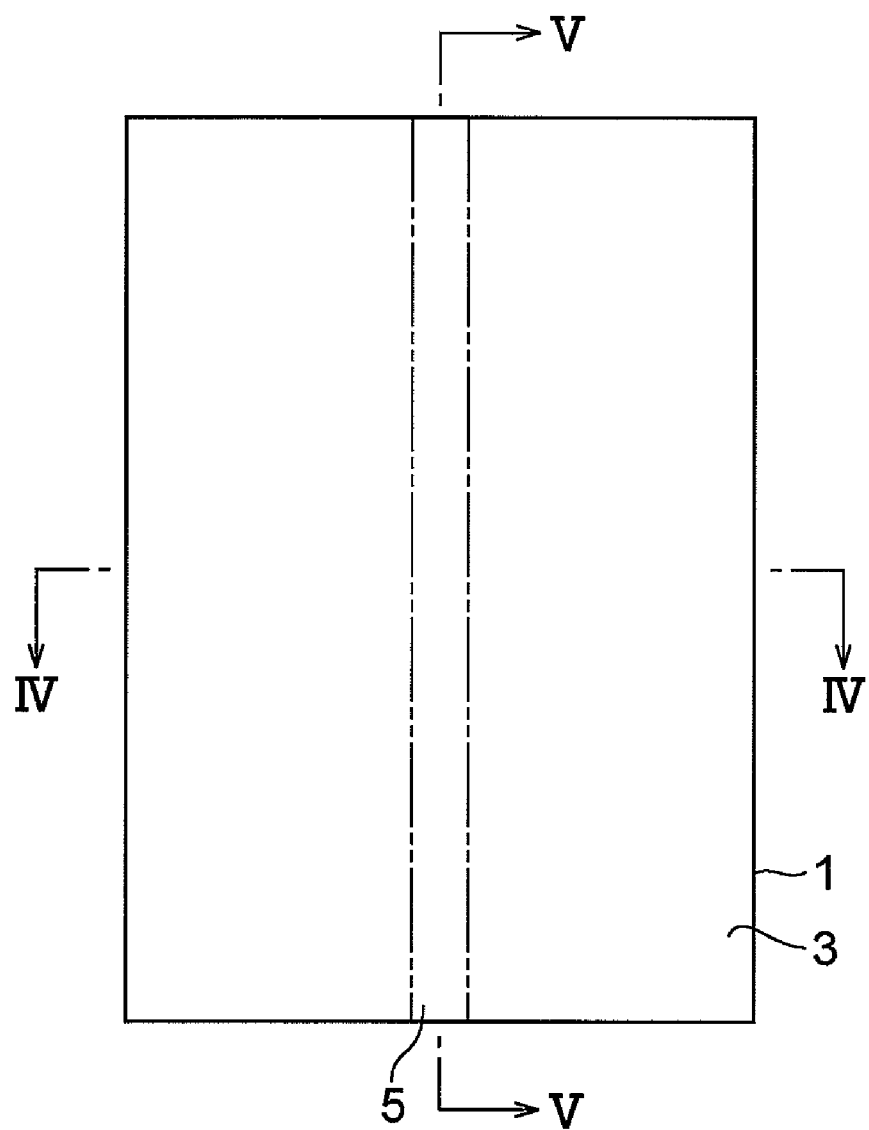
FIG. 3 is a plan view of the object after laser processing by the laser processing method in accordance with the embodiment.
Figure 4:
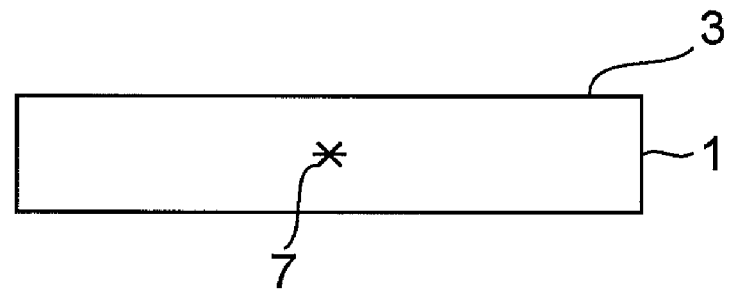
FIG. 4 is a sectional view of the object taken along the line IV-IV of FIG. 3.
Figure 5:
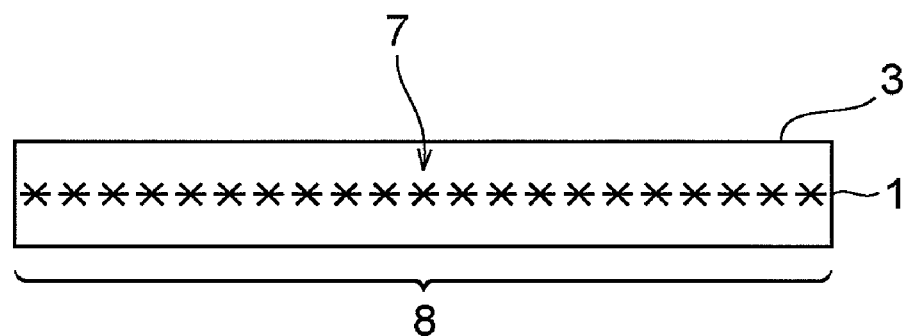
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as illustrated in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the modified region 7 is not formed by the heat of the object 1 absorbing the laser light L. The laser light L is transmitted through the object 1, so as to generate multiphoton absorption therewithin, thereby forming the modified region 7. Hence, the front face 3 of the object 1 hardly absorbs the laser light L and thus does not melt.

Figure 6:
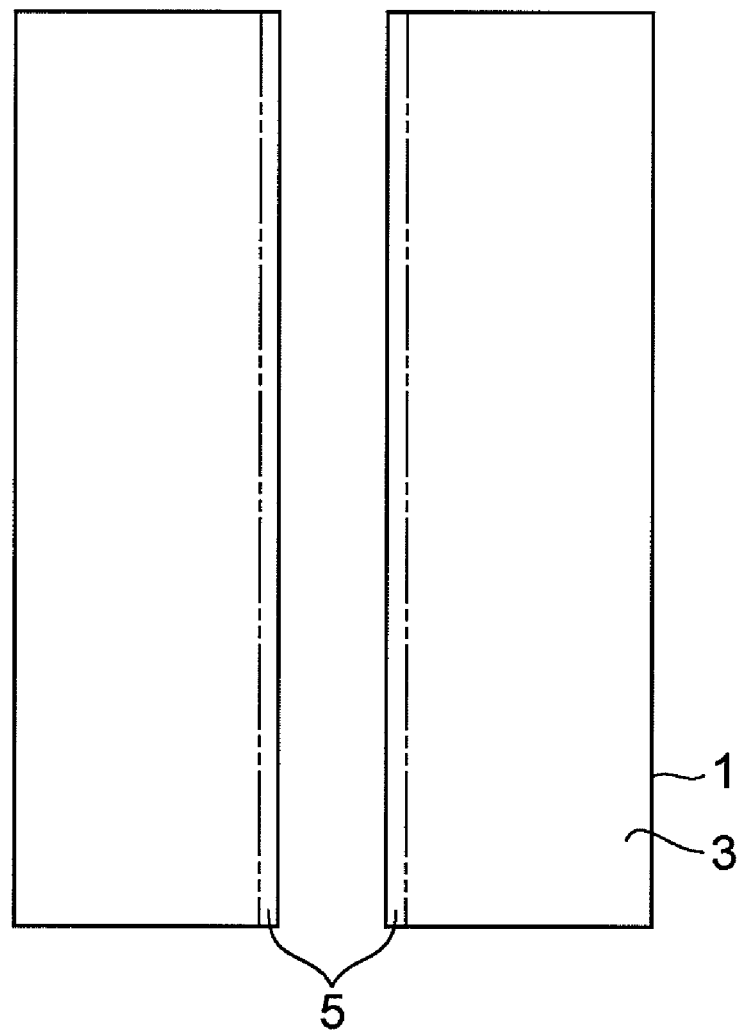
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as illustrated in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut.

This is the cutting in the case where the object 1 has a large thickness, for example. Applying an artificial force refers to exerting a bending stress or shear stress to the object 1 along the starting point region for cutting 8, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 to be processed such as a silicon wafer has recently been apt to decrease its thickness.

The modified region formed by multiphoton absorption in the laser processing method in accordance with this embodiment encompasses the following cases (1) to (3):

(1) Case Where the Modified Region is a Crack Region Including One or a Plurality of Cracks An object to be processed (e.g., glass or a piezoelectric material made of $LiTaO_3$) is irradiated with laser light while locating a converging point therewithin under a condition with a field intensity of at least $1\times10^8$ (W/cm$^2$) at the converging point and a pulse width of 1 μs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1\times10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (registered trademark) glass (with a thickness of 700 μm)
(B) Laser
    Light source: semiconductor laser pumping Nd:YAG laser
    Wavelength: 1064 nm
    Laser light spot cross-sectional area: $3.14\times10^{-8}$ cm$^2$
    Oscillation mode: Q-switched pulse
    Repetition frequency: 100 kHz
    Pulse width: 30 ns
    Output: output<1 mJ/pulse
    Laser light quality: $TEM_{00}$
    Polarizing property: linear polarization
(C) Converging lens
    Transmittance at a laser light wavelength: 60%
(D) Moving rate of the mount table mounting the object: 100 mm/sec The laser light quality of $TEM_{00}$ means that the converging characteristic is so high that convergence to about the wavelength of laser light is possible.

Figure 7:
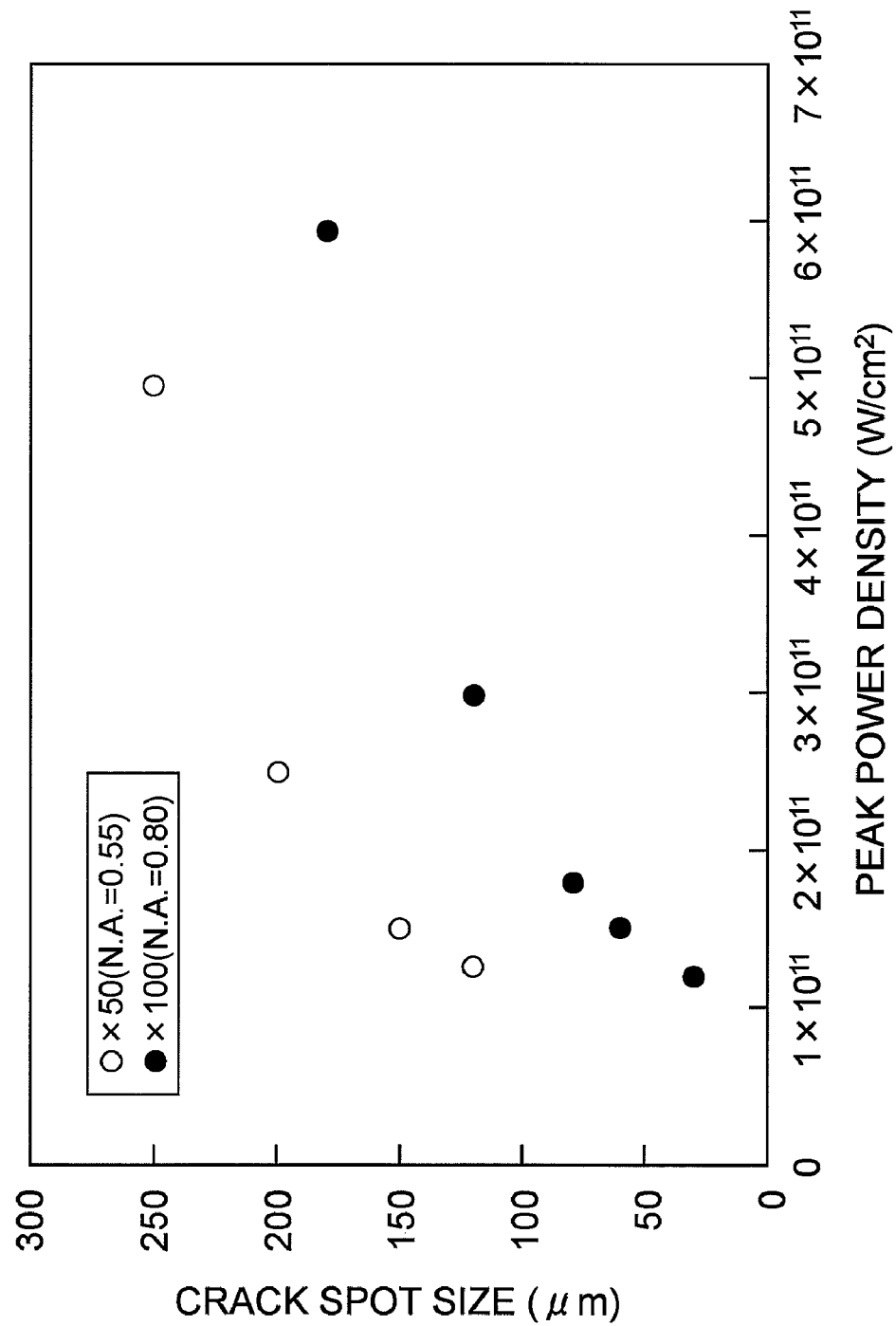
FIG. 7 is a graph illustrating relationships between the peak power density and crack spot size in the laser processing method in accordance with the embodiment.

FIG. 7 is a graph illustrating the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the converging lens (C) has a magnification of ×100 and a numerical aperture (NA) of 0.80. On the other hand, data represented by whitened circles in the graph refer to a case where the converging lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
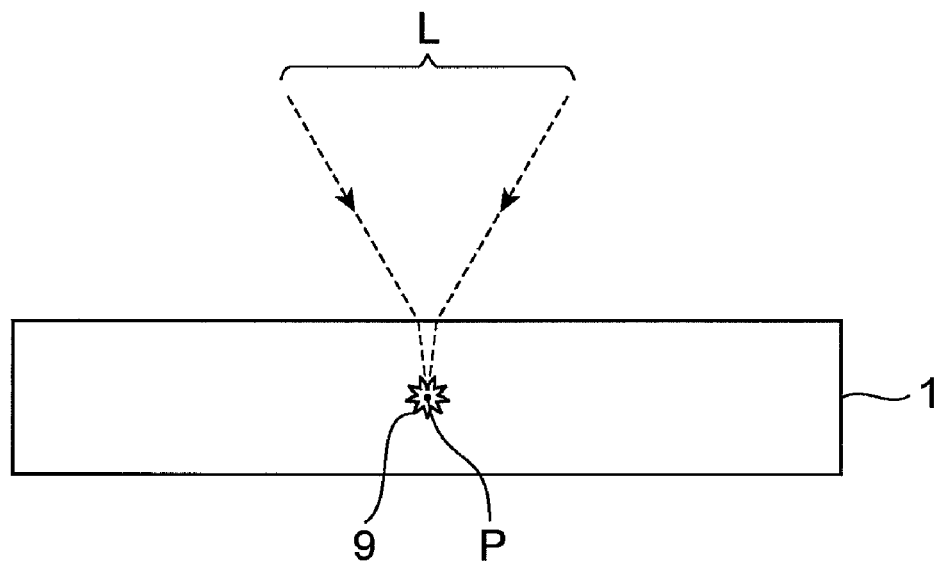
FIG. 8 is a sectional view of the object in a first step of the laser processing method in accordance with the embodiment.
Figure 9:
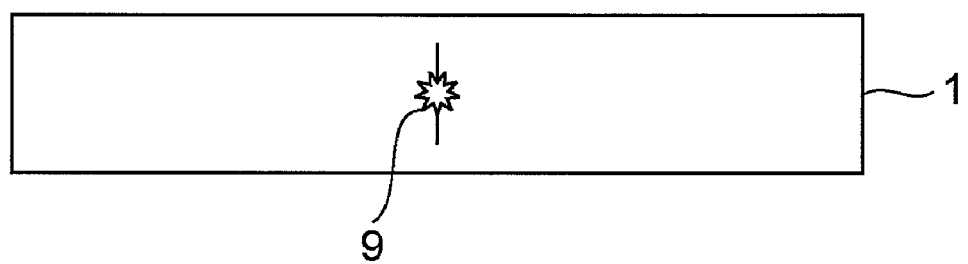
FIG. 9 is a sectional view of the object in a second step of the laser processing method in accordance with the embodiment.
Figure 10:
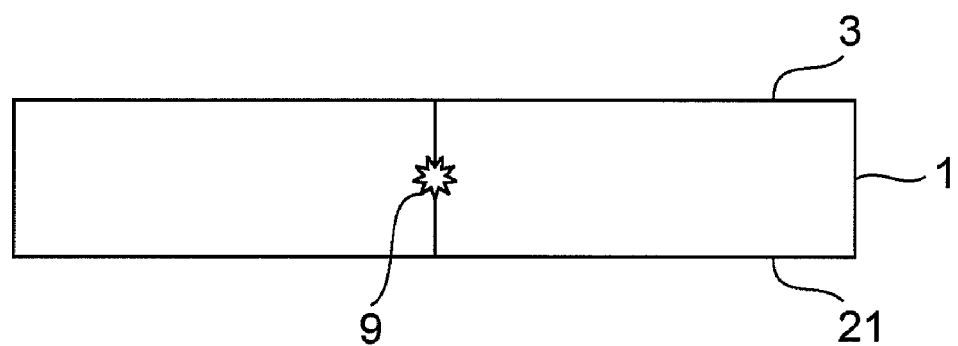
FIG. 10 is a sectional view of the object in a third step of the laser processing method in accordance with the embodiment.
Figure 11:
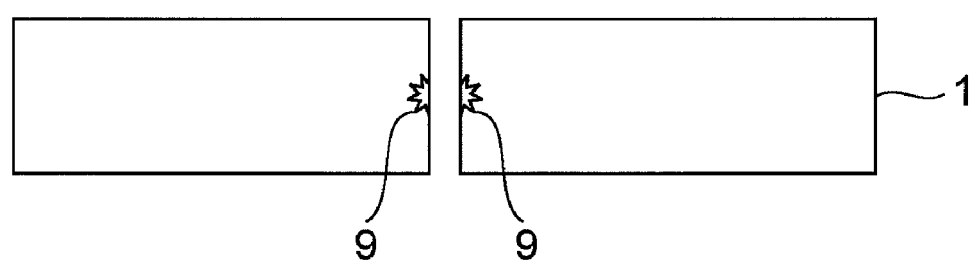
FIG. 11 is a sectional view of the object in a fourth step of the laser processing method in accordance with the embodiment.

A mechanism by which the object to be processed is cut by forming a crack region will now be explained with reference to FIGS. 8 to 11. As illustrated in FIG. 8, the object 1 is irradiated with laser light L while the converging point P is located within the object 1 under a condition where multiphoton absorption occurs, so as to form a crack region 9 therewithin along a line to cut. The crack region 9 is a region containing one or a plurality of cracks. Thus formed crack region 9 becomes a starting point region for cutting. A crack further grows from the crack region 9 acting as a start point (i.e., from the starting point region for cutting acting as a start point) as illustrated in FIG. 9, and reaches the front face 3 and rear face 21 of the object 1 as illustrated in FIG. 10, whereby the object 1 fractures and is consequently cut as illustrated in FIG. 11. The crack reaching the front face 3 and rear face 21 of the object 1 may grow naturally or as a force is applied to the object 1.

(2) Case Where the Modified Region is a Molten Processed Region

An object to be processed (e.g., semiconductor material such as silicon) is irradiated with laser light while locating a converging point within the object under a condition with a field intensity of at least $1\times10^8$ (W/cm$^2$) at the converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1\times10^{12}$ (W/cm$^2$), for example. The pulse width is preferably 1 ns to 200 ns, for example.

By an experiment, the inventors verified that a molten processed region was formed within a silicon wafer. The following are conditions of the experiment.

Figure 12:
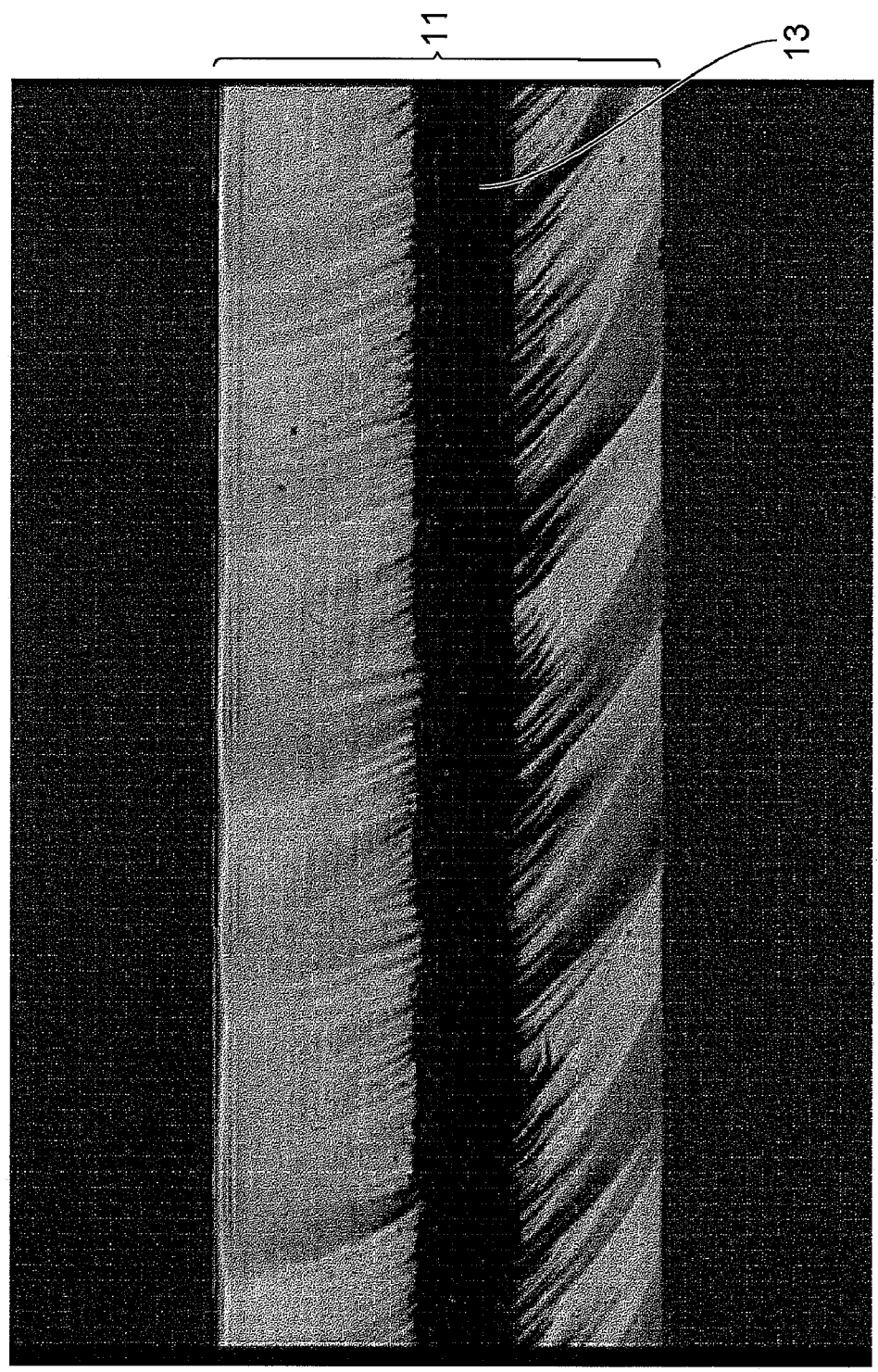
FIG. 12 is a view illustrating a photograph of a cut section in a part of a silicon wafer cut by the laser processing method in accordance with the embodiment.

(A) Object to be processed: silicon wafer (with a thickness of 350 μm and an outer diameter of 4 inches)
(B) Laser
   Light source: semiconductor laser pumping Nd:YAG laser
   Wavelength: 1064 nm
   Laser light spot cross-sectional area: $3.14 \times 10^{-8}$ cm$^2$
   Oscillation mode: Q-switched pulse
   Repetition frequency: 100 kHz
   Pulse width: 30 ns
   Output: 20 μJ/pulse
   Laser light quality: TEM$_{00}$
   Polarizing property: linear polarization
(C) Converging lens
   Magnification: ×50
   N.A.: 0.55
   Transmittance at a laser light wavelength: 60%
(D) Moving rate of the mount table mounting the object: 100 mm/sec FIG. 12 is a view illustrating a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
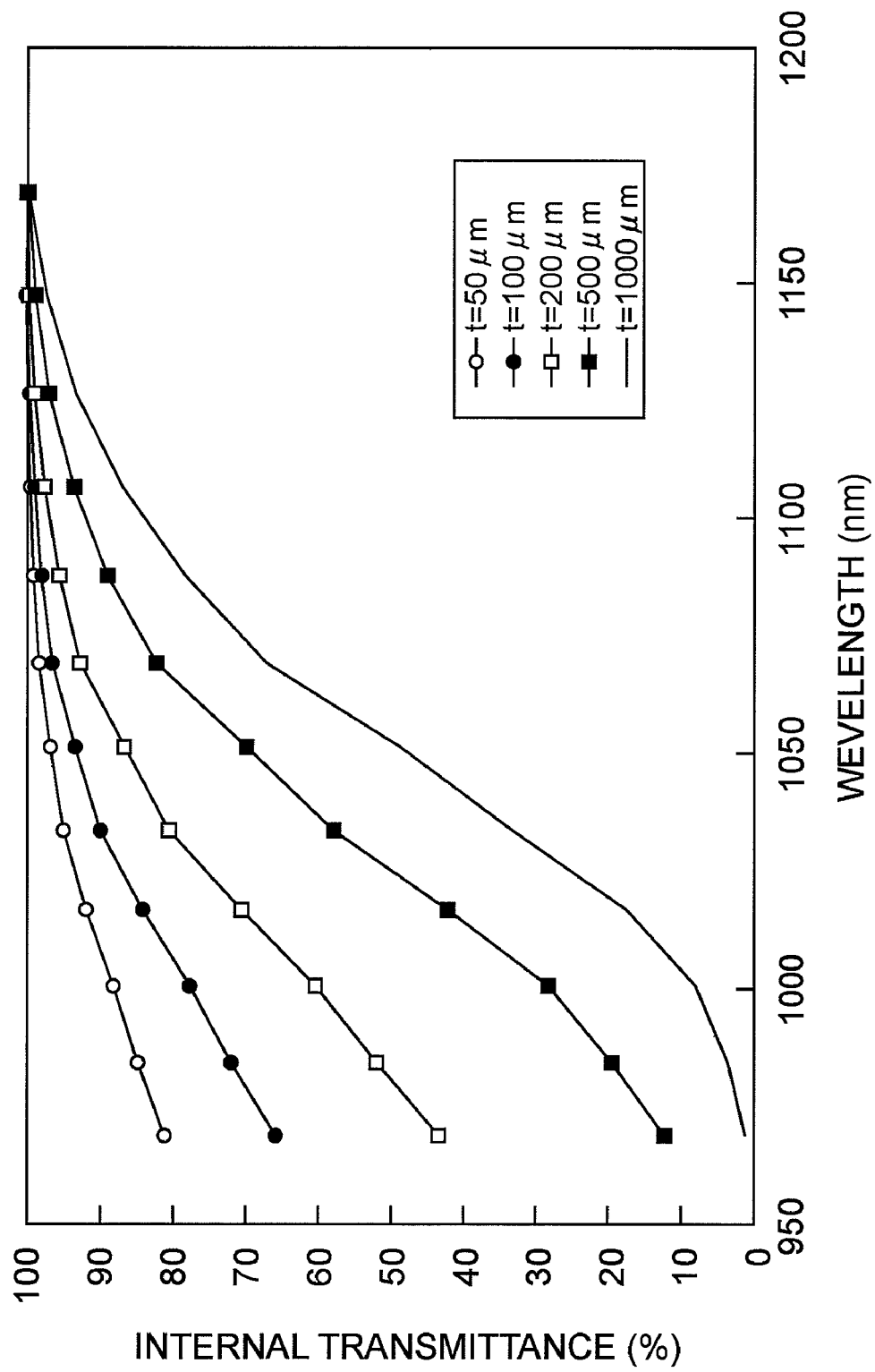
FIG. 13 is a graph illustrating relationships between the laser light wavelength and the transmittance within a silicon substrate in the laser processing method in accordance with the embodiment.

The fact that the molten processed region 13 is formed by multiphoton absorption will now be explained. FIG. 13 is a graph illustrating relationships between the laser light wavelength and the transmittance within the silicon substrate. Here, the respective reflected components on the front and rear sides of the silicon substrate are eliminated, so as to represent the internal transmittance alone. The respective relationships are illustrated in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 illustrated in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Ultrashort Pulse Laser Microprocessing of Silicon", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state in which the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as illustrated in FIG. 12. When a starting point region for cutting is thus formed within the object by a molten processed region, unnecessary fractures deviating from a starting point region for cutting line are harder to occur at the time of cleaving, whereby cleavage control becomes easier. Here, the molten processed region may be formed not only by multiphoton absorption but also by other absorption actions.

(3) Case Where the Modified Region is a Refractive Index Change Region

An object to be processed (e.g., glass) is irradiated with laser light while locating a converging point within the object under a condition with a field intensity of at least $1 \times 10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

Though the cases (1) to (3) are explained in the foregoing as a modified region formed by multiphoton absorption, a starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

That is, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the former direction, the starting point region for cutting extending in the direction to be formed with the starting point region for cutting can be formed easily and accurately with reference to the orientation flat.

The preferred embodiment of the present invention will now be explained.

Figure 14:
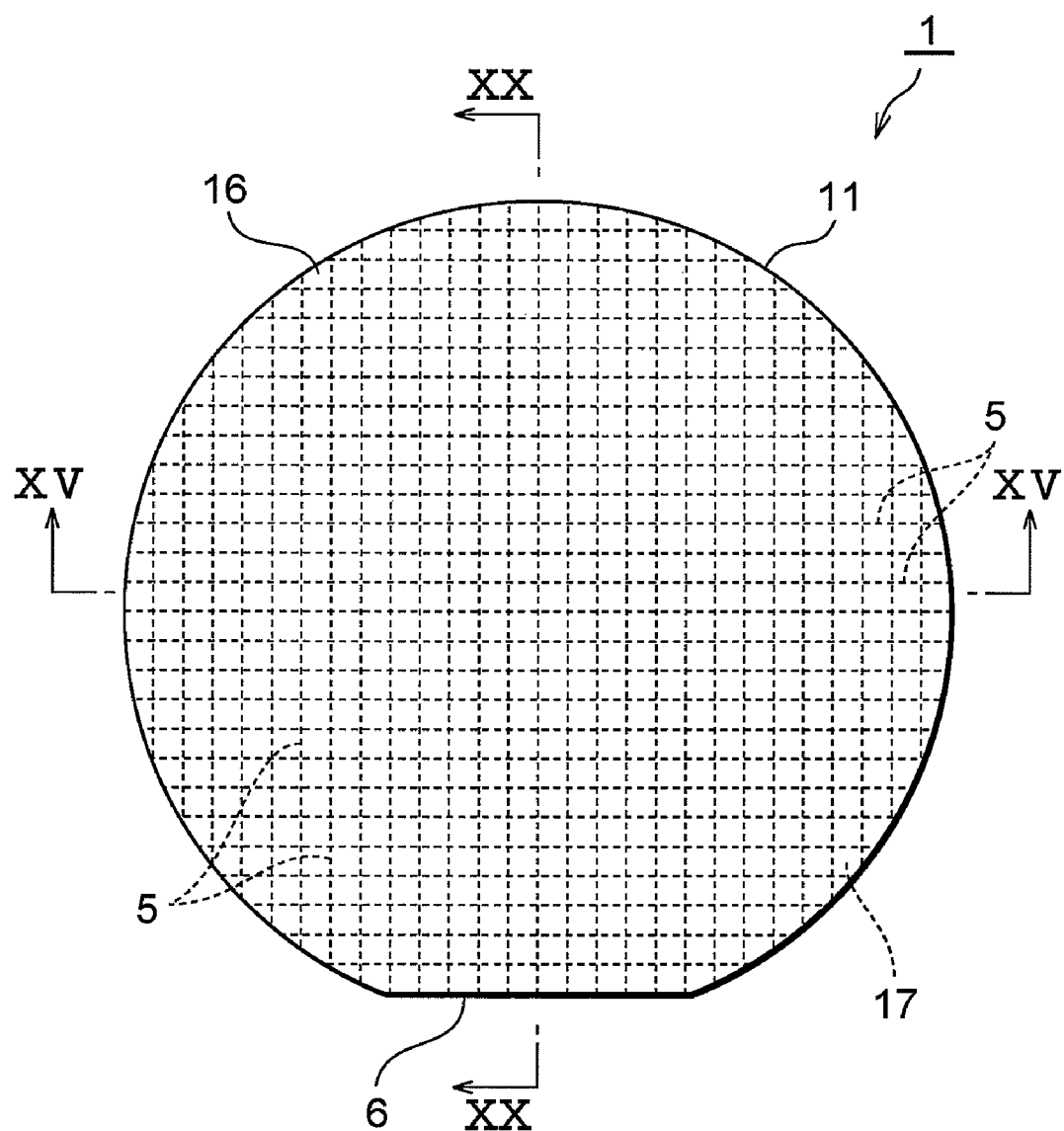
FIG. 14 is a plan view of an object to be processed for which the laser processing method in accordance with the embodiment is employed.
Figure 15:
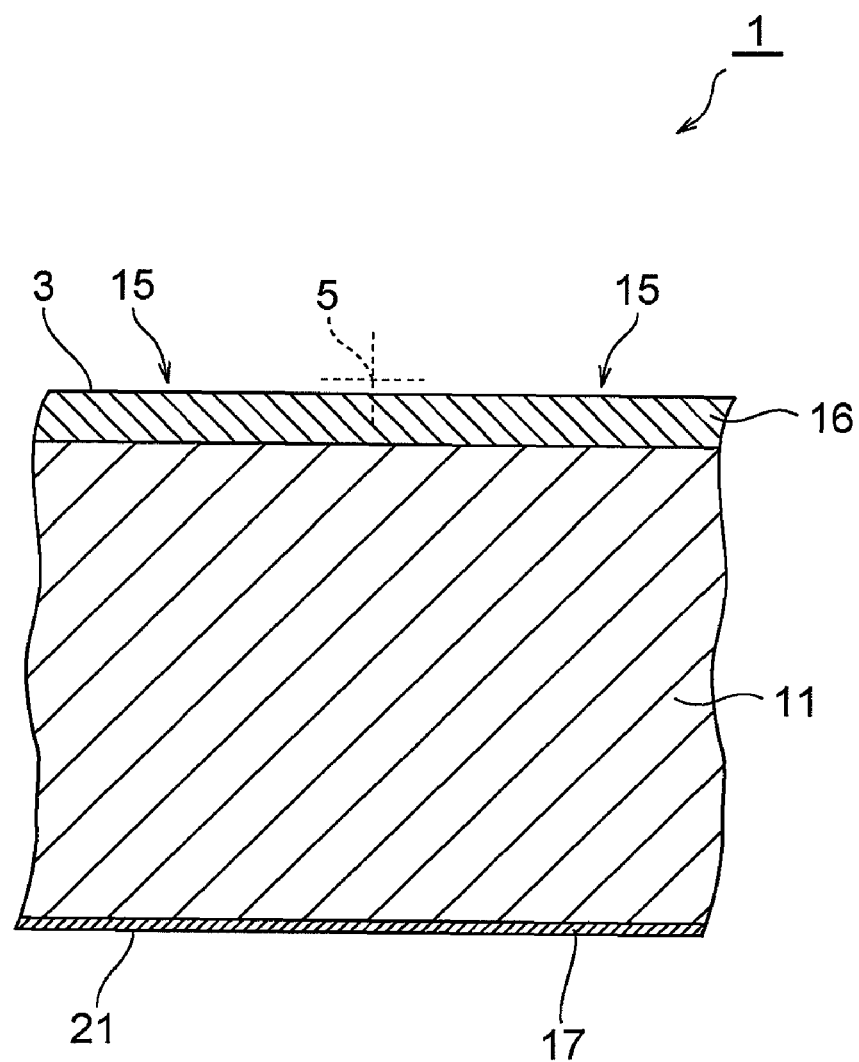
FIG. 15 is a partial sectional view taken along the line XV-XV of FIG. 14.

As illustrated in FIGS. 14 and 15, an object to be processed 1 is a so-called MEMS wafer comprising a silicon wafer (semiconductor substrate) 11 having a thickness of 300 μm, a functional device layer 16 which is formed on the front face of the silicon wafer 11 while including a plurality of functional devices 15, and a metal film 17 formed on the rear face of the silicon wafer 11. A number of functional devices 15, examples of which include mechanical constituent parts, sensors, actuators, and electronic circuits, are formed like a matrix in directions parallel and perpendicular to an orientation flat 6 of the silicon wafer 11. The metal film 17 is made of gold and has a thickness of 3 μm.

Figure 16:
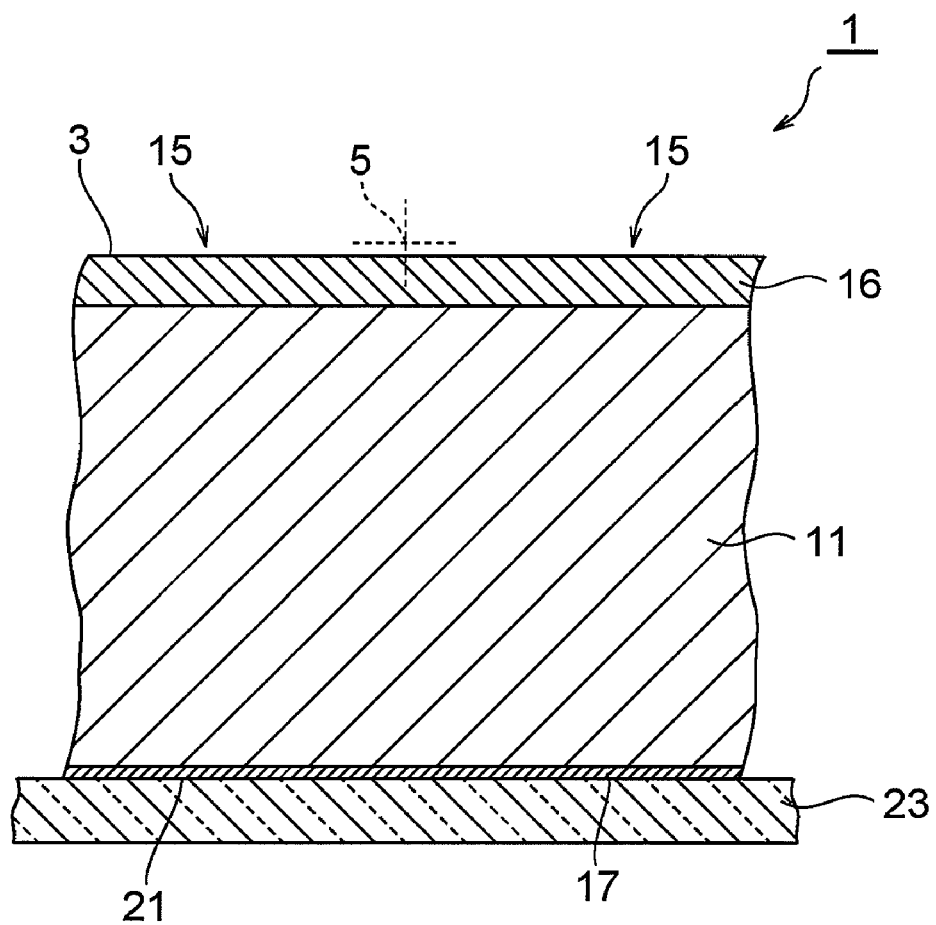
FIG. 16 is a partial sectional view of the object for explaining the laser processing method in accordance with the embodiment.

Thus constructed object 1 is cut into the functional devices 15 in the following manner. First, as illustrated in FIG. 16, an expandable tape 23 is attached to the rear face 21 of the object 1, i.e., the rear face of the metal film 17. Then, the object 1 is secured onto a mount table (not depicted) of a laser processing apparatus with the functional device layer 16 facing up.

Figure 17:
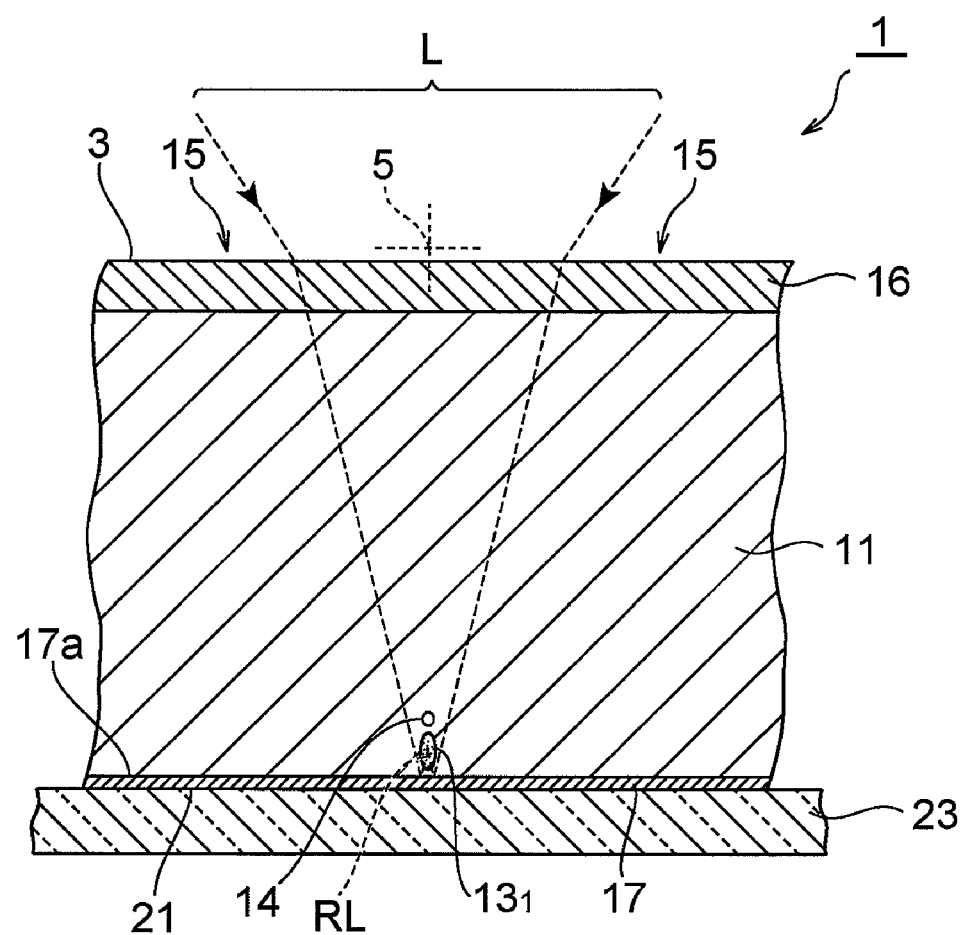
FIG. 17 is a partial sectional view of the object for explaining the laser processing method in accordance with the embodiment.

Subsequently, as illustrated in FIG. 17, the object 1 is irradiated with laser light L while using the front face 3 of the object 1, i.e., the front face of the functional device layer 16, as a laser light entrance surface and locating a converging lens at such a position that a converging point is placed at a position (on the outside of the silicon wafer 11) distanced by 320 μm from the front face of the silicon wafer 11 (assuming that the laser light passes through a laser light reflecting surface (front face 17a of the metal film 17 here) opposing the laser light entrance surface (front face 3 here) of the object; ditto in the following), and the mount table is moved so as to scan the laser light L along lines to cut 5 (see broken lines in FIG. 14) which are set like grids passing between the functional devices 15, 15 adjacent to each other.

Here, the laser light L is reflected by the front face (predetermined surface) 17a of the metal film 17 opposing the front face 3 of the object 1, and the resulting reflected light component RL irradiates the silicon wafer 11, so as to be converged within the silicon wafer 11 very close to the rear face 21. This forms a molten processed region 13$_1$ and a microcavity 14 within the silicon wafer 11 very close to the rear face 21 along the lines to cut 5. In this case, the laser light is emitted under a condition with a pulse width of 150 ns and energy of 15 μJ. The above-mentioned "position distanced by 320 μm from the front face of the silicon wafer 11" means a theoretical "position where the converging point P is located" without taking account of spherical aberration and the like.

The microcavity 14 will now be explained. In general, there is a case where a molten processed region 13 and a microcavity 14 are formed in a pair within the silicon wafer 11 when the silicon wafer 11 is irradiated with laser light while locating a converging point therewithin under such a condition that the peak power density at the converging point is $1 \times 10^8$ (W/cm$^2$) or greater while the pulse width is 1 μs or less. The microcavity 14, which may be separated from or continuous with the molten processed region 13, is formed on the downstream side of the molten processed region 13 in the advancing direction of laser light. In the case mentioned above, the microcavity 14 is formed closer to the front face 3 of the object 1 than is the molten processed region 13$_1$, so that the reflected light component RL can be said to contribute to forming the molten processed region 13$_1$ and microcavity 14. A principle by which the molten processed region 13 and a microcavity 14 are formed in a pair is described in detail in Japanese Patent Application Laid-Open No. 2005-57257.

Figure 18:
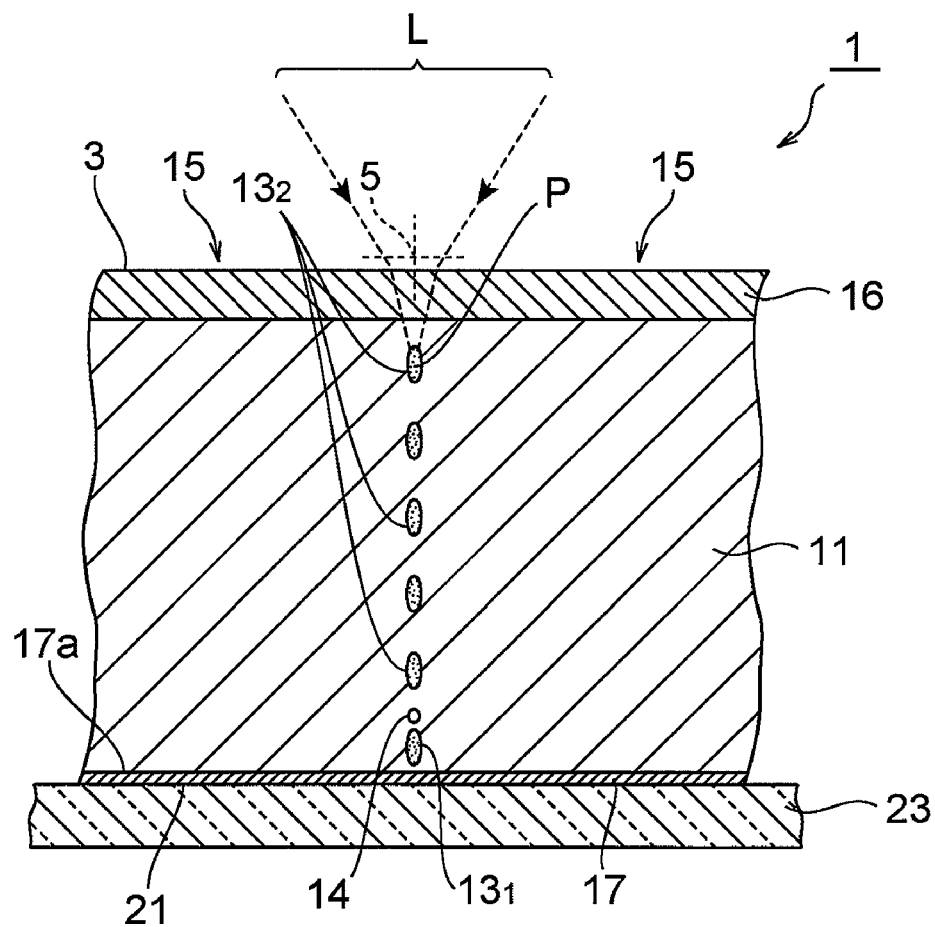
FIG. 18 is a partial sectional view of the object for explaining the laser processing method in accordance with the embodiment.

Further, as illustrated in FIG. 18, the laser light L is emitted while using the front face 3 of the object 1 as a laser light entrance surface and locating the converging point P within the silicon wafer 11, and the mount table is moved so as to scan the converging point P along the lines to cut 5 set like grids passing between the functional devices 15, 15 adjacent to each other.

The scanning of the converging point P along the lines to cut 5 is performed five times per line to cut 5 with respective distances from the front face of the silicon wafer 11 to the position where the converging point P is located, so as to form five rows of molten processed regions 13$_2$ between the molten processed region 13$_1$ and the front face of the silicon wafer 11 along the lines to cut 5. The number of rows of molten processed regions 13$_2$ formed within the silicon wafer 11 per line to cut 5 is not limited to 5 but varies depending on the thickness of the silicon wafer 11 and the like. There is also a case where a microcavity 14 paired with each molten processed region 13$_2$ is formed closer to the rear face 21 of the object 1 than is the molten processed region 13$_2$. The molten processed regions 13$_1$, 13$_2$ may include cracks.

Figure 19:
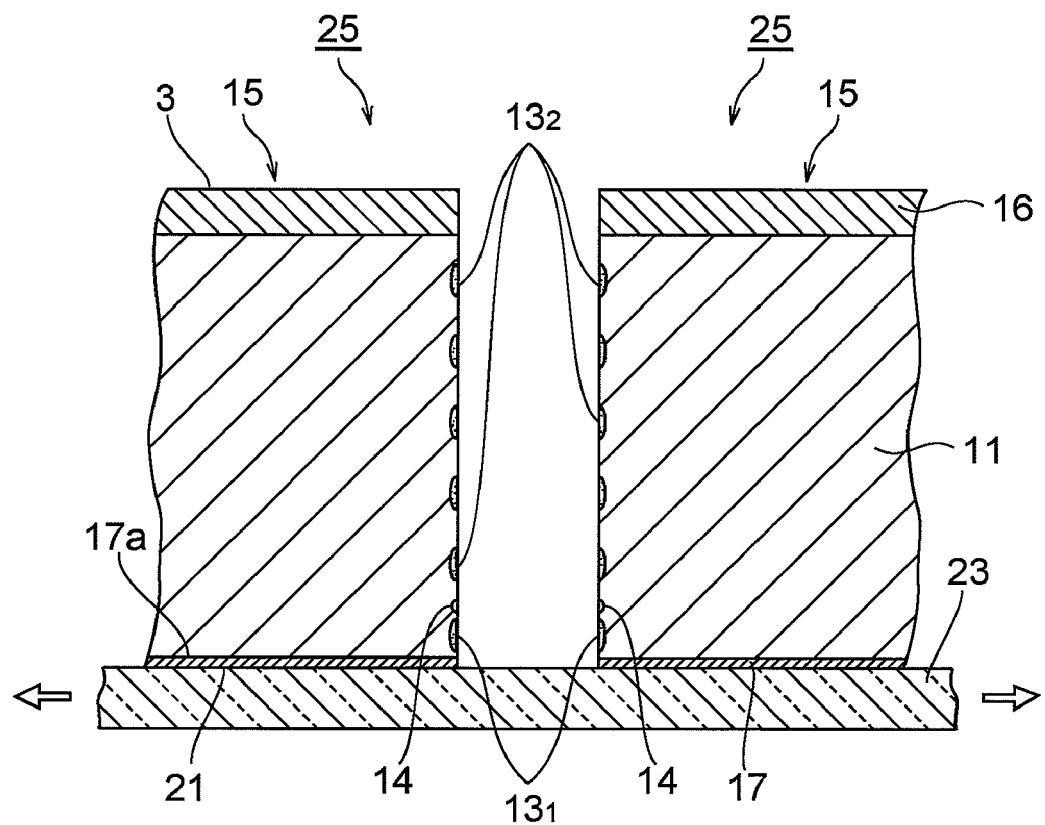
FIG. 19 is a partial sectional view of the object for explaining the laser processing method in accordance with the embodiment.

Subsequently, as illustrated in FIG. 19, the expandable tape 23 is expanded, so as to cut the object 1 along the lines to cut 5 from the molten processed regions 13$_1$, 13$_2$ acting as a cutting start point. At this time, since the expandable tape 23 is expanded, a plurality of semiconductor chips 25 obtained by the cutting are separated from each other.

Figure 26:
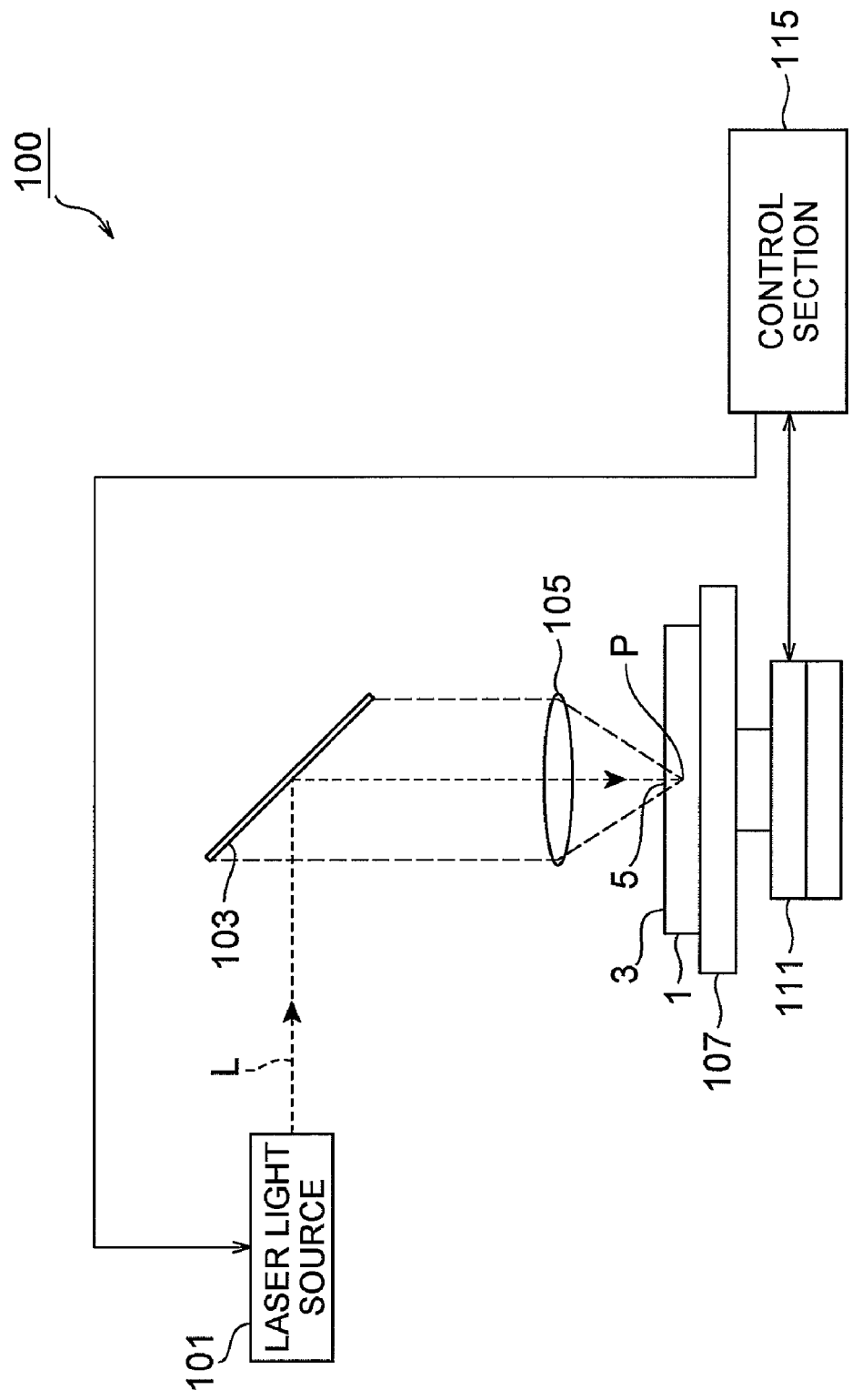
FIG. 26 is a schematic configuration diagram of the laser processing apparatus in accordance with an embodiment.

The above-mentioned laser processing method is carried out by a laser processing apparatus illustrated in FIG. 26. As illustrated in FIG. 26, the laser processing apparatus 100 comprises a laser light source 101 for emitting the laser light L, a dichroic mirror 103 arranged such as to change the direction of the optical axis of the laser light L by 90°, and a converging lens 105 for converging the laser light L. The laser processing apparatus 100 also comprises a mount table 107 for supporting the object 1 to be irradiated with the laser light L converged by the converging lens 105, a stage 111 for moving the mount table 107 in X-, Y-, and Z-axis directions, and a control section 115 for controlling the whole laser processing apparatus 100 so as to regulate the output, pulse width, and the like of the laser light L, movement of the stage 111, and so forth.

In the laser processing apparatus 100, the laser light L emitted from the laser light source 101 changes the direction of its optical axis by 90° at the dichroic mirror 103, so as to be converged by the converging lens 105 toward the object mounted on the mount table 107. Concurrently therewith, the stage 111 is moved, so that the object 1 is moved along the lines to cut 5 relative to the laser light L. This forms modified regions to become a cutting start point within the object 1 along the lines to cut 5.

Figure 20:
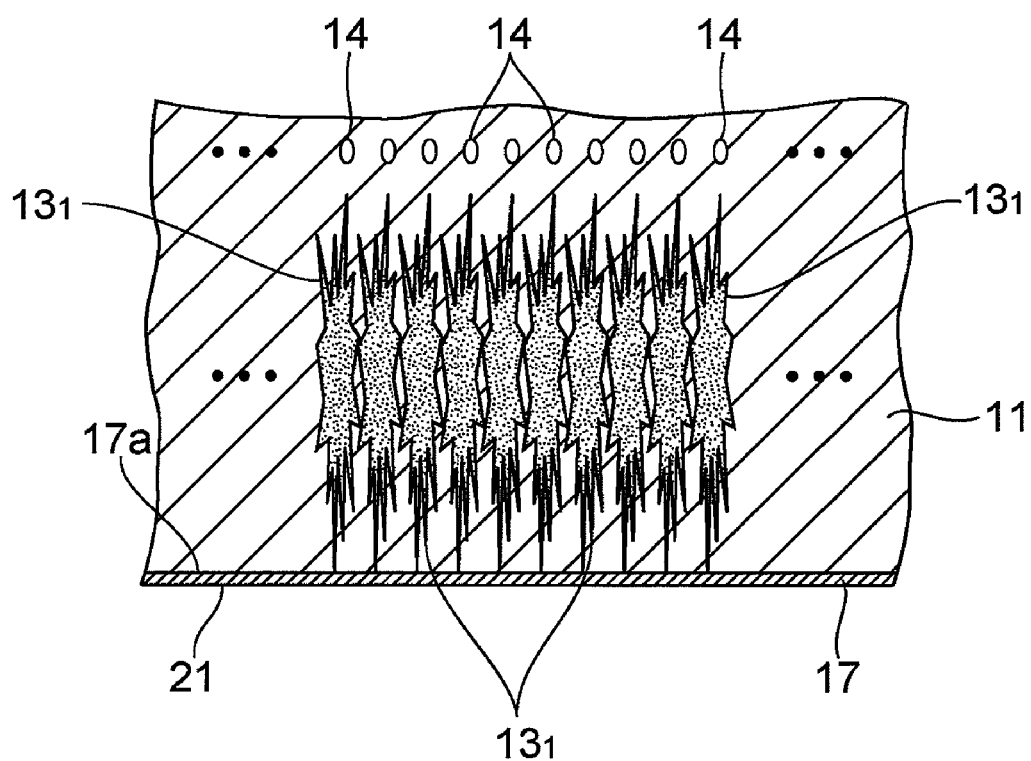
FIG. 20 is a partial sectional view taken along the line XX-XX of FIG. 14.

As explained in the foregoing, by irradiating the silicon wafer 11 with the reflected light component RL of the laser light L reflected by the front face 17a of the metal film 17 opposing the front face 3 of the object 1 acting as the laser light entrance surface, the above-mentioned laser processing method forms the molten processed region 13$_1$ closest to the front face 17a of the metal film 17 in the six rows of molten processed regions 13$_1$, 13$_2$. This can form the molten processed region 13$_1$ very close to the front face 17a of the metal film 17 as illustrated in FIG. 20. Thus utilizing the reflected light component RL for forming the molten processed region 13$_1$ closest to the front face 17a of the metal film 17 can stably form the molten processed region 13$_1$ very close to the front face 17a of the metal film 17 with a high density along the lines to cut 5 even when the molten processed region 13$_1$ is hard to form in the vicinity of the front face 17a while keeping the same height position in the case where the thickness of the silicon wafer 11 varies along the lines to cut 5, the case where the silicon wafer 11 is a highly doped wafer or the like exhibiting a low transmittance to the laser light L, and so forth. As a consequence, the end part on the rear face 21 side of a cut section formed when cutting the object 1 can be prevented from deviating from the lines to cut 5, whereby the object 1 can accurately be cut along the lines to cut 5.

Principles by which the molten processed region $13_1$ is formed very close to the front face 17a of the metal film 17 when the reflected light component RL of the laser light L reflected by the front face 17a of the metal film 17 is utilized will now be explained.

Figure 21:
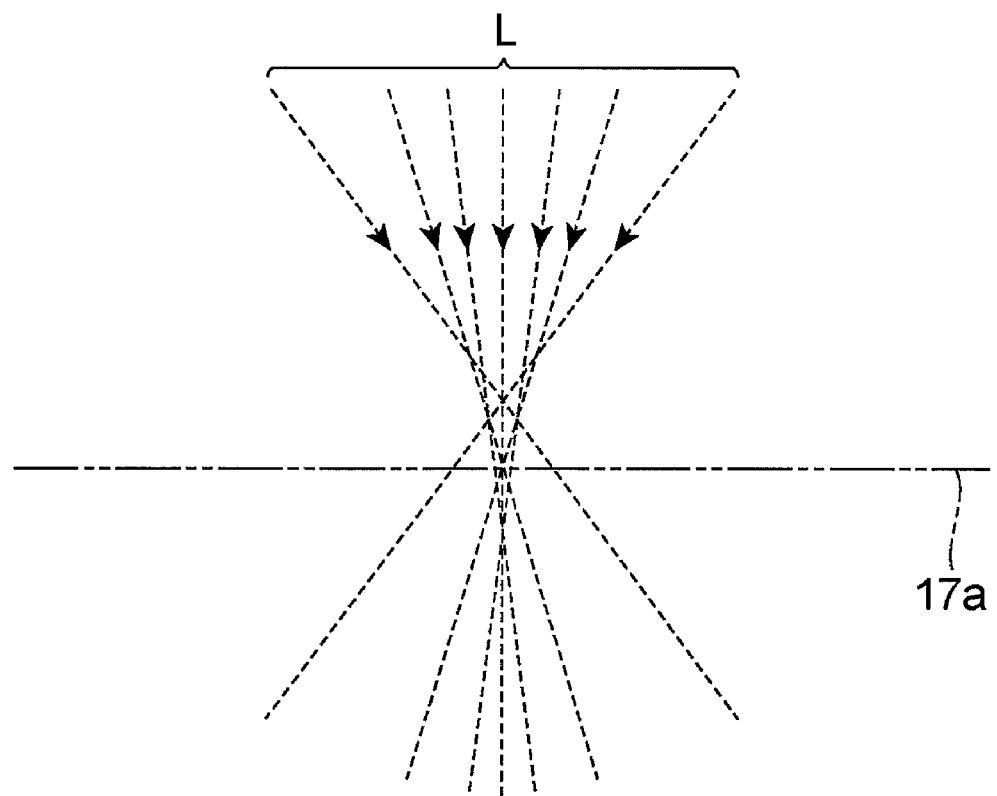
FIG. 21 is a view for explaining a first principle of the laser processing method in accordance with the embodiment.

The following is the first principle presumed by the inventors. When the laser light L is emitted such that the converging point is located near the rear face of the silicon wafer 11, i.e., the front face 17a of the metal film 17, the center light beam and marginal light beams lower their degrees of convergence under the influence of spherical aberration and thus fail to converge at a single point, whereby the converging positions of the light beams, those of marginal light beams in particular, shift from each other in the optical axis direction as illustrated in FIG. 21. As a consequence, the converging positions of the light beams advancing such as to converge under the front face 17a of the metal film 17 are reflected by the front face 17a of the metal film 17 so as to be superposed on the converging positions of the light beams converged onto the front face 17a of the metal film 17. This forms the molten processed region $13_1$ very close to the front face 17a of the metal film 17 with a high density along the lines to cut 5. Though the molten processed region $13_1$ is theoretically supposed to be formed on the rear face of the silicon wafer 11 where the converging point is located when spherical aberration is not considered, the position where the molten processed region $13_1$ is formed can be said to shift upward under the influence of reflection.

Figure 22:
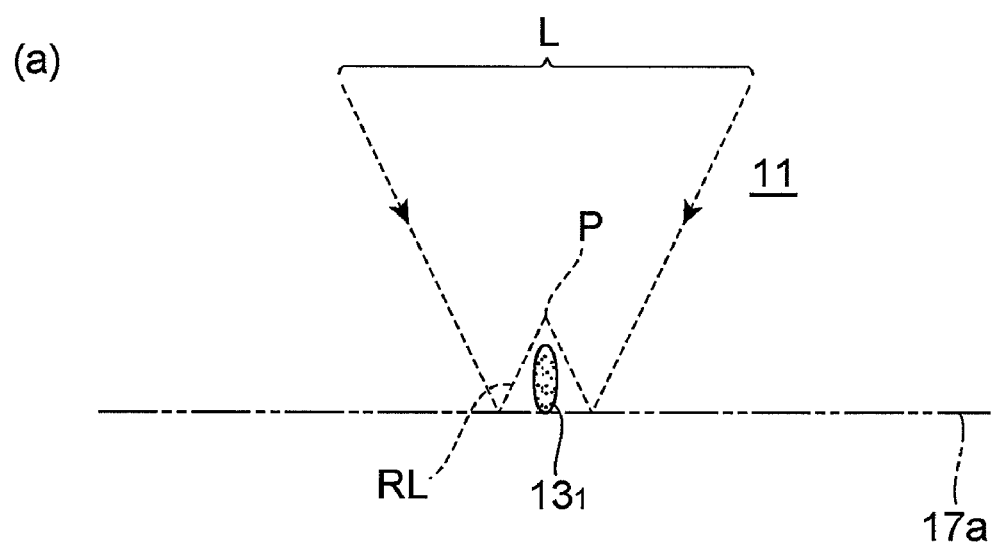
FIG. 22 is a view for explaining a second principle of the laser processing method in accordance with the embodiment.
Figure 22:
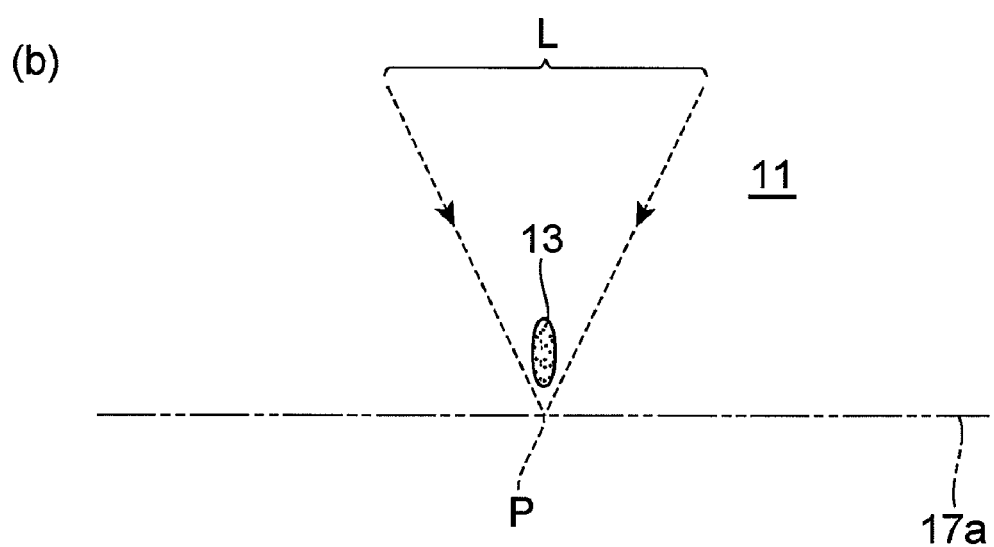

The following is the second principle presumed by the inventors. When the laser light L is emitted with the converging lens located such that the converging point is positioned outside of the silicon wafer, i.e., the converging point is located under the front face 17a of the metal film 17, the laser light L is reflected by the front face 17a of the metal film 17, so that the resulting reflected light component RL is converged within the silicon wafer 11 as illustrated in FIG. 22(a). Before being reflected by the front face 17a of the metal film 17, the laser light L has such a low degree of convergence that it is hardly absorbed by the silicon wafer 11, whereby a locally high temperature is attained at the converging point P of the reflected light component RL. Therefore, the absorption coefficient rises at the converging point P because of the temperature dependency of absorption coefficient, thereby making it easier to absorb the reflected light component RL on the upstream side (the reflecting surface 17a side) of the converging point P of the reflected light component RL in the advancing direction of the reflected light component RL. As a result, the molten processed region $13_1$ is formed very close to the front face 17a of the metal film 17 with a high density (i.e., as a modified region with a high divisibility) along the lines to cut 5.

Meanwhile, when the laser light L is emitted such that the converging point P is located within the silicon wafer 11, i.e., on the front face 17a of the metal film 17 as illustrated in FIG. 22(b), temperature increases on the upper side of the converging point P as well. Therefore, the absorption coefficient rises on the upper side of the converging point P because of the temperature dependency of absorption coefficient, whereby the laser light L begins to be absorbed. This reduces the laser light L advancing near the converging point P in the advancing direction of the laser light L, whereby the part on the upper side of the converging point P locally attains a high temperature along the optical axis of the laser light L. Hence, the part on the upper side of the converging point P raises the absorption coefficient because of the temperature dependency of absorption coefficient, thereby absorbing the laser light L. As a result, the energy of the laser light L usable for forming a molten processed region 13 decreases, so that the molten processed region 13 is formed at a position slightly separated upward from (the vicinity of) the front face 17a of the metal film 17 with a low density along the lines to cut 5. This is presumed to be because the absorption becomes more influential at a position deeper from the laser light entrance surface in a thick wafer, so as to reduce the energy of the laser light, whereby the influence of temperature dependency by the absorption cannot be neglected for exceeding a processing threshold.

The present invention is not limited to the above-mentioned embodiment.

Figure 23:
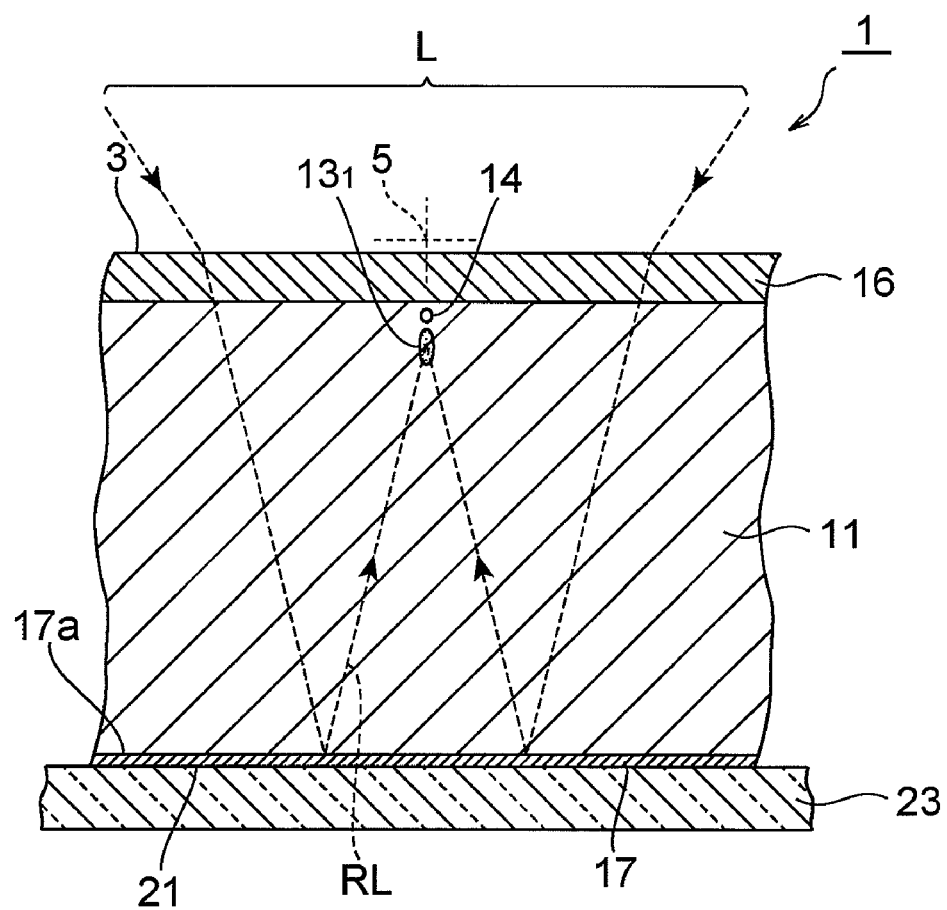
FIG. 23 is a partial sectional view of the object for explaining the laser processing method in accordance with another embodiment.
Figure 24:
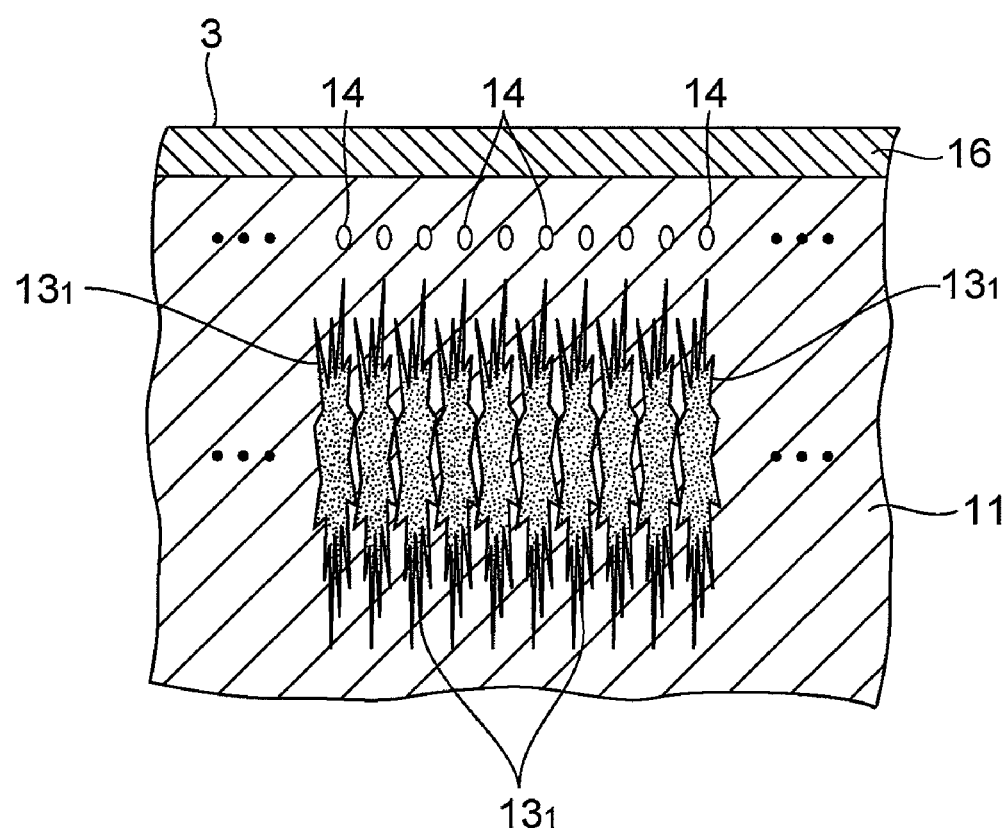
FIG. 24 is a partial sectional view taken along the line XX-XX of FIG. 14.

For example, though the above-mentioned embodiment forms the molten processed region $13_1$ very close to the front face 17a of the metal film 17 by irradiating the silicon wafer 11 with the reflected light component RL of the laser light L reflected by the front face 17a of the metal film 17, the molten processed region $13_1$ may be formed very close to the front face 3 of the object 1 as illustrated in FIGS. 23 and 24. In this case, the laser light L is emitted while using the front face 3 of the object 1 as a laser light entrance surface and locating a converging point at a position (on the outside of the silicon wafer 11) distanced from the front face of the silicon wafer 11 by 600 µm under a condition with a pulse width of 150 ns and energy of 15 µJ. This can prevent the front face 3 of the object 1 from incurring damages such as melting because of the temperature dependency of absorption coefficient mentioned above, so as to form the molten processed region $13_1$ very close to the front face 3 of the object 1. This can also keep an end part on the front face 3 side of a cut section formed when cutting the object 1 from deviating from the lines to cut 5, whereby the object 1 can accurately be cut along the lines to cut 5.

Not only the molten processed region 13 closest to the front face 17a of the metal film 17 and the molten processed region 13 closest to the front face 3 of the object 1, but a plurality of rows of molten processed regions 13 including at least one row of the molten processed region 13 closest to the front face 17a of the metal film 17 and the molten processed region 13 closest to the front face 3 of the object 1 in a plurality of rows of molten processed regions 13 may also be formed by utilizing the reflected light component RL of the laser light L reflected by the front face 17a of the metal film 17.

Figure 25:
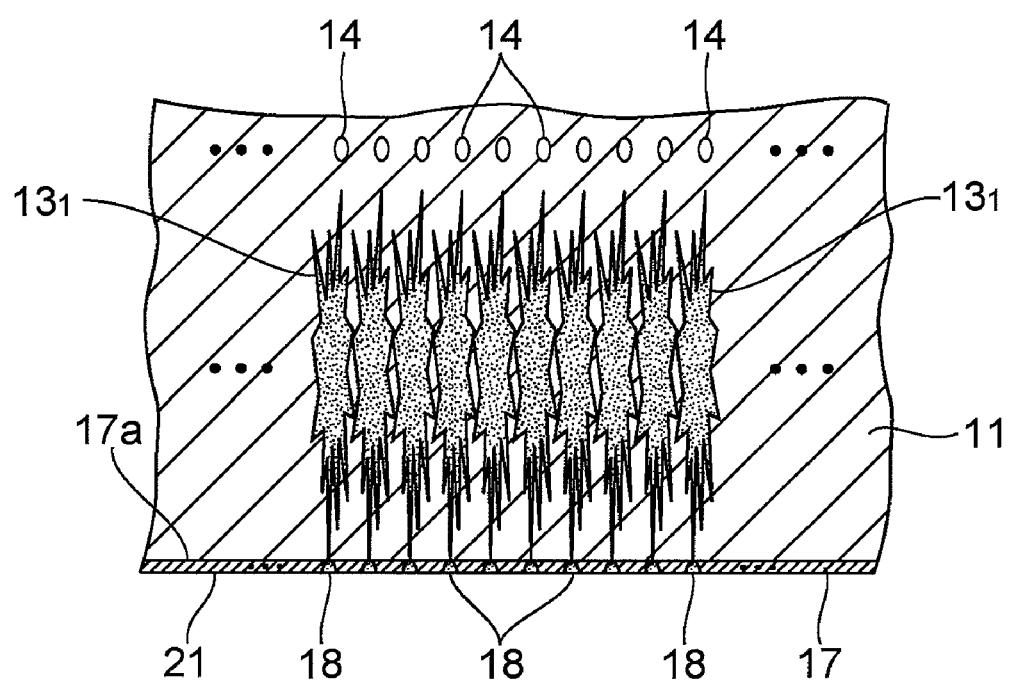
FIG. 25 is a partial sectional view taken along the line XX-XX of FIG. 14.

As illustrated in FIG. 25, a weakened region 18 having a predetermined depth may be formed at the rear face 21 of the object 1 along the lines to cut 5 simultaneously with the molten processed region $13_1$ closest to the front face 17a of the metal film 17. In this case, the laser light L is emitted while using the front face 3 of the object 1 as a laser light entrance surface and locating a converging point at a position (on the outside of the silicon wafer 11) distanced from the front face of the silicon wafer 11 by 305 µm under a condition with a pulse width of 150 ns and energy of 15 µJ. Though the rear face 21 of the object 1 is the rear face of the metal film 17 here, the object 1 can accurately be cut along the lines to cut 5 with a relatively small external force in this case as well since the weakened region 18 having a predetermined depth is formed in the metal film 17 along the lines to cut 5. Also, particles can be prevented from occurring from the molten processed region $13_1$ since it is formed within the silicon wafer 11.

Though the surface reflecting the laser light L is the front face 17a of the metal film 17 in the above-mentioned embodiment, the object 1 may be free of the metal film 17, so that the rear face of the silicon wafer 11 acts as a surface reflecting the laser light L, for example. In this case, the laser light L is partly reflected by the rear face of the silicon wafer 11, so that the resulting reflected light component RL irradiates the silicon wafer 11. Examples of the functional device 15 include semiconductor operating layers formed by crystal growth, light-receiving devices such as photodiodes, light-emitting devices such as laser diodes, and circuit devices formed as circuits.

Though the above-mentioned embodiment employs the front face 3 of the object 1 as the laser light entrance surface, the rear face 21 of the object 1 may be used as the laser light entrance surface when the object 1 lacks the metal film 17. When the rear face 21 of the object 1 is used as the laser light entrance surface, the object 1 is cut into a plurality of semiconductor chips 25 as follows, for example. A protective tape is attached to the front face of the functional device layer 16 and, while the functional device layer 16 is protected by the protective tape, the protective tape holding the object 1 is secured to the mount table of the laser processing apparatus. Then, the silicon wafer 11 is irradiated with the laser light L while using the rear face 21 of the object 1 as the laser light entrance surface, so as to form the molten processed regions $13_1$, $13_2$ along the lines to cut 5. Subsequently, the protective tape secured to the mount table is released therefrom together with the object 1. Then, the expandable tape 23 is attached to the rear face 21 of the object 1, the protective tape is peeled off from the front face of the functional device layer 16, and thereafter the expandable tape 23 is expanded, so as to cut the object 1 along the lines to cut 5 from the molten processed regions $13_1$, $13_2$ acting as a cutting start point and separate the plurality of semiconductor chips 25 obtained by the cutting from each other.

Though the above-mentioned embodiment forms the molten processed regions $13_1$, $13_2$ within the silicon wafer 11, other modified regions such as crack regions and refractive index change regions may be formed within wafers made of other materials such as glass and piezoelectric materials.

Modified regions 7 may be formed in the object 1 as follows. First, as illustrated in FIG. 27(a), a modified region 7a is formed by irradiating the object 1 with the laser light L such that a position near a laser light reflecting surface (rear face 21 here) opposing a laser light entrance surface (front face 3 here) becomes the converging point P. Thereafter, as illustrated in FIG. 27(b), a modified region 7b is formed by the reflected light component RL of the laser light L emitted such that a position on the downstream side (on the opposite side of the laser light reflecting surface from the laser light source (laser light exit side)) of the laser light reflecting surface in the advancing direction of the laser light becomes the converging point P assuming that the laser light passes through the laser light reflecting surface. Thus forming the modified regions 7a, 7b in a superposed manner can make the modified regions 7 with a high density (i.e., high divisibility) in the object 1.

One row of a modified region 7 may be formed at least within the object 1 along one line to cut 5 instead of forming a plurality of rows of modified regions 7 aligning in the thickness direction of the object 1 at least within the object 1 along one line to cut 5 by irradiating the object 1 with the laser light L.

INDUSTRIAL APPLICABILITY

The present invention can form the modified region closest to a predetermined surface very close to the predetermined surface or the modified region closest to a laser light entrance surface very close to the laser light entrance surface with a favorable controllability.

The invention claimed is:

1. A laser processing method of irradiating a planar object to be processed with laser light, so as to form a plurality of rows of modified regions to become a cutting start point aligning in a thickness direction of the object within the object along a line to cut the object;
   the method irradiating the object with a reflected light component of the laser light reflected by a predetermined surface opposing a laser light entrance surface where the laser light is incident on the object, so as to form one or more rows of modified regions including at least one row of the modified region closest to the predetermined surface and the modified region closest to the laser light entrance surface in the plurality of rows of modified regions.

2. A laser processing method according to claim 1, wherein the predetermined surface is a surface on the laser light entrance surface side of a metal film provided with the object.

3. A laser processing method according to claim 1, wherein the object is cut along the line to cut from the plurality of rows of modified regions acting as a cutting start point.

4. A laser processing method according to claim 1, wherein the object has a semiconductor substrate, and wherein the modified region includes a molten processed region.

5. A laser processing method of irradiating a planar object to be processed with laser light, so as to form a modified region to become a cutting start point within the object along a line to cut the object;
   the method forming the modified region at least within the object by irradiating the object with the laser light while assuming that the laser light passes through a laser light reflecting surface opposing a laser light entrance surface of the object and arranging a converging lens for converging the laser light at the object such that a position downstream of the laser light reflecting surface in an advancing direction of the laser light becomes a converging point of the laser light converged by the converging lens.

6. A laser processing apparatus for irradiating a planar object to be processed with laser light, so as to form a modified region to become a cutting start point within the object along a line to cut the object;
   the apparatus including a control section for forming the modified region at least within the object by irradiating the object with the laser light while assuming that the laser light passes through a laser light reflecting surface opposing a laser light entrance surface of the object and arranging a converging lens for converging the laser light at the object such that a position downstream of the laser light reflecting surface in an advancing direction of the laser light becomes a converging point of the laser light converged by the converging lens.

7. A laser processing method according to claim 1, wherein a molten processed region and a microcavity are formed in a pair as the modified region by irradiating the object with the reflected light component of the laser light reflected by the predetermined surface, and the microcavity is formed closer to the predetermined surface of the object than is the molten processed region.

8. A laser processing method according to claim 7, wherein a converging point of the laser light is theoretically located on the object if spherical aberration is not considered when irradiating the object with the reflected light component of the laser light reflected by the predetermined surface.

9. A laser processing method according to claim 5, wherein a molten processed region and a microcavity are formed in a pair as the modified region by irradiating the object with the reflected light component of the laser light reflected by the laser light reflecting surface, and the microcavity is formed closer to the predetermined surface of the object than is the molten processed region.

10. A laser processing method according to claim 9, wherein the converging point of the laser light is theoretically located on the object if spherical aberration is not considered when irradiating the object with the reflected light component of the laser light reflected by the laser light reflecting surface.

* * * * *